(12) United States Patent
Kim et al.

(10) Patent No.: US 7,065,867 B2
(45) Date of Patent: Jun. 27, 2006

(54) LOW TEMPERATURE HERMETIC SEALING METHOD HAVING PASSIVATION LAYER

(75) Inventors: Woon-bae Kim, Suwon (KR);
Hyung-jae Shin, Seongnam (KR);
Chang-ho Cho, Suwon (KR);
Seung-goo Kang, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 335 days.

(21) Appl. No.: 10/293,933

(22) Filed: Nov. 14, 2002

(65) Prior Publication Data

US 2003/0104651 A1 Jun. 5, 2003

(30) Foreign Application Priority Data

Dec. 4, 2001 (KR) ............................... 2001-76235

(51) Int. Cl.
*H05K 3/30* (2006.01)

(52) U.S. Cl. ............................ 29/841; 29/412; 29/415; 29/592.1; 29/832; 29/840; 174/250; 361/748; 438/108; 438/125; 438/126; 83/929.1

(58) Field of Classification Search .................. 29/846, 29/412–415, 592.1, 832, 840, 841; 174/250; 361/748; 438/108, 118, 119, 125, 126; 83/51, 83/861, 929.1, 929.2
See application file for complete search history.

(56) References Cited

U.S. PATENT DOCUMENTS 3,610,870 A * 10/1971 Sakamoto ..................... 219/93
5,550,398 A 8/1996 Kocian et al.
5,923,995 A * 7/1999 Kao et al. ..................... 438/460
6,046,074 A * 4/2000 McHerron et al. ........... 438/119
6,062,461 A * 5/2000 Sparks et al. ............. 228/123.1
6,093,576 A * 7/2000 Otani ............................. 438/5
6,839,962 B1 * 1/2005 Aigner et al. ................. 29/846

FOREIGN PATENT DOCUMENTS

| JP | 6318625 | 11/1994 |
|---|---|---|
| JP | 63-240051 A | 10/1998 |
| WO | 01/56921 A2 | 8/2001 |

OTHER PUBLICATIONS

Korean Patent Office Action dated Dec. 29, 2003.

* cited by examiner

*Primary Examiner*—Richard Chang
(74) *Attorney, Agent, or Firm*—Sughrue Mion, PLLC

(57) ABSTRACT

A hermetic sealing method, which is capable of preventing oxidation of a micro-electromechanical system (MEMS) and sealing the MEMS at a low temperature. A low temperature hermetic sealing method having a passivation layer includes depositing a junction layer, a wetting layer, and a solder layer on a prepared lid frame, depositing a first protection layer for preventing oxidation on the solder layer and forming a lid, preparing a package base on which a device is disposed, and in which a metal layer and a second protection layer are formed around the device, and assembling the lid and the package base, heating, and sealing them. The protection layer is laminated on the solder layer that is formed by the lid, thereby preventing oxidation without using a flux. The low temperature hermetic sealing method having a passivation layer is suitable for sealing a device, such as the MEMS, which is sensitive to heat, water and other by-products.

10 Claims, 5 Drawing Sheets

LOW TEMPERATURE HERMETIC SEALING METHOD HAVING PASSIVATION LAYER

BACKGROUND OF THE INVENTION

1. Field of the Invention

The present invention relates to a hermetic sealing method and, more particularly, to a hermetic sealing method, which is capable of preventing oxidation of a micro-electromechanical system (MEMS) and sealing the MEMS at a low temperature.

This application is based on Korean Patent Application No. 2001-76235 filed on Dec. 4, 2001, the disclosure of which is incorporated herein by reference in its entirety.

2. Description of the Related Art

In general, a micro-electromechanical system (MEMS) is manufactured through photolithography, deposition, and etching after a very thin metal layer or a thin film, such as oxide and polymer, is laminated on a silicon substrate. The MEMS is very thin and microscopic, and thus is very sensitive to the environments of high temperature, fine dust, water or gas. In particular, a capillary phenomenon due to water or by-products, and a surface force, such as Van der Waals force, causes adhesion. Thus, in order to prevent adhesion, it is necessary to maintain a predetermined atmosphere in a cavity of a package. In order to maintain this atmosphere, the package must have definite sealing properties, and thus, various hermetic sealing methods have been developed.

Methods for sealing the MEMS include a wafer level bonding method and a chip level sealing method. However, a device such as a micromirror that is employed in the MEMS has weak heat resistance properties and is very susceptible to an environment of adhesion due to water or by-products, and thus, taking into consideration the characteristics of the MEMS, the most appropriate sealing method must be selected.

The wafer level bonding method includes an anodic bonding method, a glass and glass frit bonding method, an adhesive bonding method, and a low melting eutectic bonding method. In the anodic bonding method and the glass frit bonding method, the sealing is performed at a high temperature of over 400° C. As described previously, the device such as a micromirror that is employed in the MEMS has very weak heat resistance properties, and thus, the anodic bonding method and the glass frit bonding method that are performed at a high temperature are not suitable for sealing the device. In the adhesive bonding method, due to the penetration of water contained in an adhesive as well as water penetrated from an external environment, perfect hermetic sealing is not possible.

In addition, there is the chip level sealing method, which includes a seam welding method, a soldering method, and an adhesive bonding method. In the seam welding method, damages to a device due to heat can be comparatively reduced, and hermetic sealing is possible, but the components and the facilities required for the seam welding method are costly. On the other hand, in the sealing method by Sn—Pb soldering, hermetic sealing is possible at a comparatively low price, but Sn—Pb is melted at a comparatively high temperature (about over 183° C.) in a MEMS manufacturing process, and wetting defects due to an oxide layer that is formed in the MEMS manufacturing process become sealing defects, and an environmental problem due to a Pb component occurs.

More specifically, FIG. 1 illustrates a conventional semiconductor device package disclosed in U.S. Pat. No. 5,550,398. An optical window 101 having a metal layer 102 is attached to a metal frame 104 by a solder preform 103 and is sealed in a housing 105, such as a ceramic package. The solder preform 103 is made of Au—Sn, which is a costly process that also requires a proper cleaning so as to prevent contamination and oxidation.

The optical window 101 is manufactured by soldering in the atmosphere of gas injected during sealing, a Kovar ring is brazed in the housing 105, and the optical window 101 is sealed in the housing 105 by a seam welding or a laser welding. The process is very complicated and costly to manufacture.

FIG. 2 illustrates a conventional method disclosed in U.S. Pat. No. 6,046,074. First through third thin film sealbands 112, 113 and 114 used for wetting a solder are sequentially deposited on a substrate 111 on which a chip c is formed, and on a cap 116. Then, solder 115 is disposed between the cap 116 and the substrate 111, is heated and sealed. The solder 115 is provided with preform having a band shape, and is formed of Sn—Pb or Pb-free solder, which is an alloy made up of In, Ag, Sb, and Bi. However, a Pb or Cd-family solder contaminates an environment, and thus, Pb-free solder has been widely used. Among the Pb-free solders, In has a comparatively low melting point of about 156° C., and alloy of Sn, Bi, Ag, and Zn plus In has a comparatively low melting point of about 118–170° C. and a high ductility, and thus is a suitable material for hermetic sealing of a device with weak heat resistance properties, such as a MEMS.

However, the Pb-free solder is easily oxidized after deposition or during sealing, and thus, in order to prevent this, the Pb-free solder must be etched with a strong acid such as HCL, or dry-etched. Thus, the manufacturing process becomes complicated. The difficulty in manufacturing is that the Pb-free solder must be immediately sealed so as to prevent the Pb-free solder from being re-oxidized after etching. Also, defects may occur in a device after sealing due to water or a by-product, which is generated during etching. Further, when the Pb-free solder is heated at a high temperature during sealing, an oxide layer is formed, and thereby, defects in wetting, voids and cracks occur and a perfect hermetic sealing cannot be performed.

A flux is used to remove the oxide layer, but the flux is formed of acid rosin, and thus oxidizes and damages Al and other corrosive metals of a MEMS, and thus, adhesion occurs due to a by-product generated by the flux.

FIG. 3 illustrates a conventional method disclosed in U.S. Pat. No. 6,062,461. A solderable ring 118 is formed around a wafer 119 on which a MEMS device 121 is formed, and a solderable layer 117 is formed on a part of the upper surface of a capping wafer 120 or on the entire upper surface of the capping wafer 120. Then, the solderable ring 118 is joined to the solderable layer 117 and is soldered at a low temperature. Here, the solderable layer 117 is formed through plating, evaporation, and sputtering and is comprised of Sn—Pb or Pb-free solder, which is an alloy made up of In, Sn, Ag, Sb, and Bi. However, since this method also uses the Pb-free solder, problems due to oxidation described earlier remain.

SUMMARY OF THE INVENTION

To solve the above-described problems, it is an aspect of the present invention to provide a low temperature hermetic sealing method having a passivation layer, which is capable of preventing the penetration of water and oxidation, which causes the adhesion of a micro-electromechanical system (MEMS), and which is capable of improving the reliability of a device by maintaining a predetermined atmosphere in the device.

Accordingly to achieve the above-described aspect, a method consistent with the present invention relates to a low temperature hermetic sealing method having a passivation layer. The method includes depositing a junction layer, a wetting layer, and a solder layer on a prepared lid frame, depositing a first protection layer for preventing oxidation on the solder layer and forming a lid, preparing a package base on which a device is disposed, and in which a metal layer and a second protection layer are formed around the device, and assembling the lid and the package base, heating, and sealing them.

The lid frame is formed of one selected from glass, quartz, Si, ceramic, and Kovar.

The junction layer is formed of Cr, Ti or alloy of Cr and Ti.

The wetting layer is formed of Ni, Cu, or an alloy of Ni and Cu.

The solder layer is formed of at least one selected from In, Sn, Bi, Ag, and Zn.

The first protection layer is formed of Au.

To further solve the above-described problems, another aspect of the present invention is to provide a low temperature hermetic sealing method having a passivation layer. The method includes laminating a junction layer, a wetting layer, and a solder layer on a wafer and forming a lid wafer, depositing a first protection layer for preventing oxidation on the solder layer, manufacturing micro-electromechanical system (MEMS) devices on a package base wafer, depositing a metal layer and a second protection layer on the package base wafer, assembling the lid wafer and the package base wafer so that the lid wafer and the package base wafer are opposite to each other, heating the lid wafer and the package base wafer so that the first protection layer is absorbed into the solder layer, and sealing the lid wafer and the package base wafer, and dicing the sealed wafer in units of a device.

BRIEF DESCRIPTION OF THE DRAWINGS

The above aspects and advantages of the present invention will become more apparent by describing in detail illustrative, non-limiting embodiments thereof with reference to the accompanying drawings, in which.

DETAILED DESCRIPTION OF THE INVENTION

Figure 1:
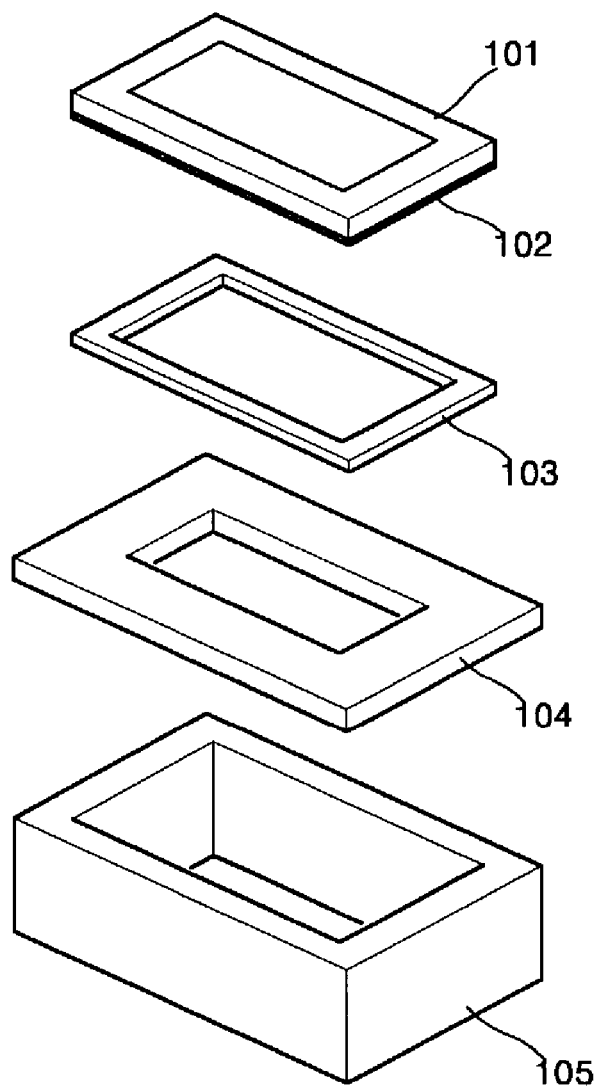
FIGS. 1 through 3 illustrate conventional hermetic sealing methods.
Figure 2:
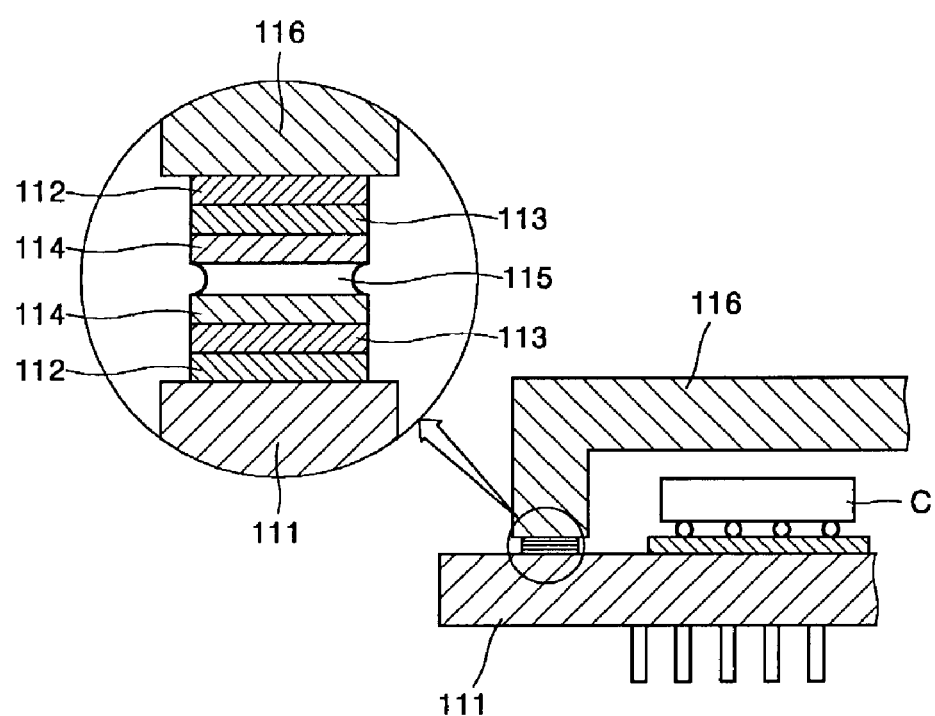
Figure 3:
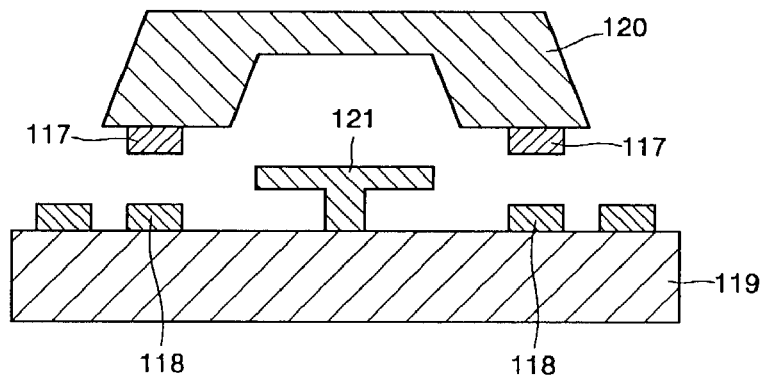

The present invention will now be described in detail by describing illustrative, non-limiting embodiments thereof with reference to the accompanying drawings. In the drawings, the same reference characters denote the same elements.

Figure 4:
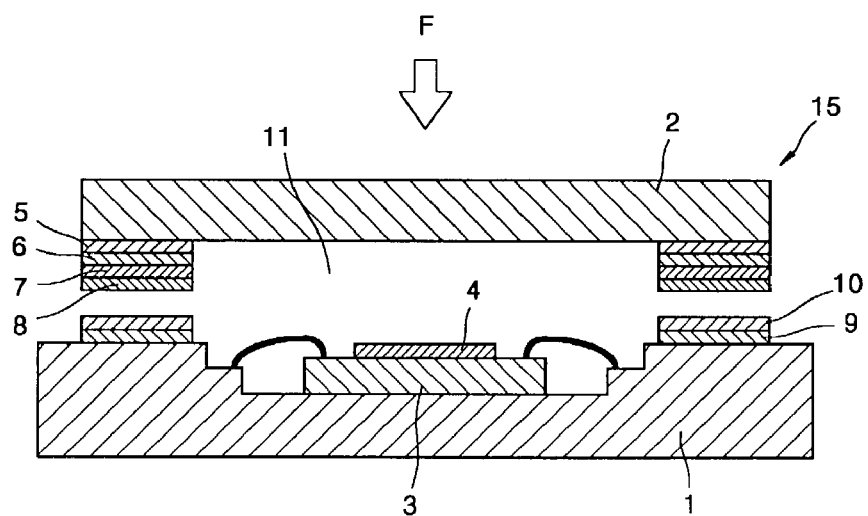
FIG. 4 shows an illustrative, non-limiting embodiment of a low temperature hermetic sealing method having a passivation layer according to the present invention.

FIG. 4 shows a low temperature hermetic sealing method having a passivation layer according to the present invention includes forming a package base 1 with a chip die 3 on which a micro-electromechanical system (MEMS) device 4 is disposed. Also, FIG. 4 shows forming a lid 15, which is to be disposed on the package base 1 to form a cavity 11, and sealing the package base 1 and the lid 15.

A junction layer 5 and a wetting layer 6 are deposited on a lid frame 2, and a solder layer 7, which is melted at a sealing temperature, serves as a sealant and thereby is maintained in a sealed state with layers contacting both sides of the solder layer 7, and a first protection layer 8 for preventing the oxidation of the solder layer 7 after deposition and while sealing are sequentially laminated on the wetting layer 6, thereby the lid 15 is formed. The wetting layer 6 wets the solder layer 7 when the solder layer 7 is melted at the sealing temperature, and thereby is maintained in a sealed state with faces contacting both sides of the solder layer 7, and thus preventing the diffusion of a solder component.

The lid frame 2 may be formed of a transparent material, such as glass, quartz, or a material, such as Si, ceramic, and Kovar, and the junction layer 5 may be formed of Cr or Ti. Preferably, the wetting layer 6 is formed of Ni and Cu, and the solder layer 7 is formed of at least one selected from In, Sn, Bi, Ag, and Zn, and the first protection layer 8 is formed of Au. Also, the thickness of the first protection layer 8 is, preferably, but not necessarily, less than 1000 Å.

The junction layer 5, the wetting layer 6, and the solder layer 7 are laminated through heat or e-beam evaporation, sputtering, electroplating, non-electrolysis deposition, and screen printing and are manufactured in a high vacuum apparatus so as to prevent the oxidation of each layer.

Meanwhile, the chip die 3 on which the MEMS device 4 is formed, is disposed on the package base 1, and a metal layer 9 and a second protection layer 10 for preventing oxidation are sequentially laminated on the package base 1 around the chip die 3. Preferably, but not necessarily, the metal layer 9 is formed of Cr and Ni, and the second protection layer 10 is formed of Au.

The package base 1 may be formed of a material, such as Al, AlN, and low temperature co-fired ceramic (LTCC), and metal, such as Kovar and Alloy42, and glass.

As above, after the package base 1 and the lid 15 are prepared, the package base 1 and the lid 15 are assembled by injecting gas such as hydrogen or nitrogen, in an oven, a chamber, a hot plate, and a furnace in a sealed environment. Then, in a case where the package base 1 and the lid 15 are heated at a temperature over a common melting point and are compressed by an appropriate pressure F, the package base 1 and the lid 15 are adhered by thermal compound of the solder layer 7 with a layer adjacent to both sides of the solder layer 7 and are heated for an appropriate amount of time, and then cooled. Next, the cavity 11 is formed between the lid 15 and the package base 1, and thereby sealing is completed.

Figure 5A:
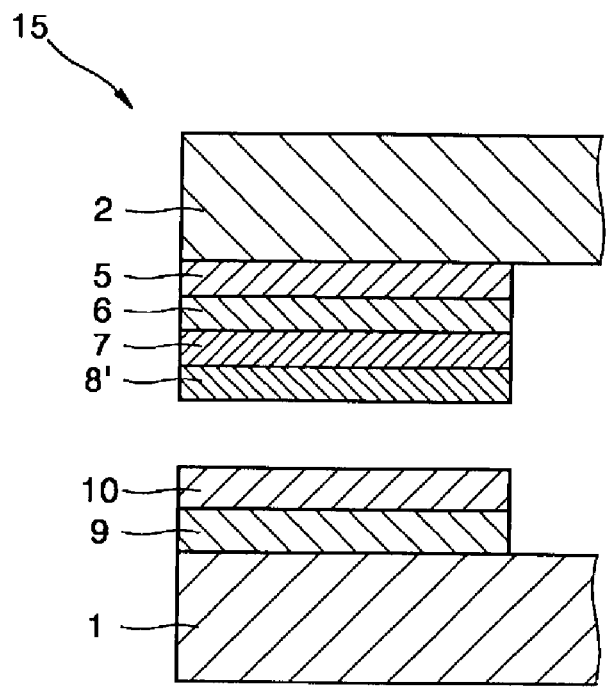
FIGS. 5A and 5B illustrate the step of sealing in the low temperature hermetic sealing method having a passivation layer according to the present invention.

The oxidation-prevention function due to the first protection layer 8 is implemented by the following mechanism. Referring to FIG. 5A, for example, a Cr junction layer 5 and a Ni wetting layer 6 having an appropriate thickness are deposited on the upper surface of the lid frame 2. In a case where the first protection layer 8 made up of Au is deposited on the solder layer 7 formed of, for example, In, while a deposition apparatus is maintained in a vacuum state, a thin layer 8' made up of an $AuIn_2$ compound when Au reacts with In is formed. The thin layer 8' serves as a protection layer for preventing the oxidation of the solder layer 7 and is a thermally stable compound.

Figure 5B:
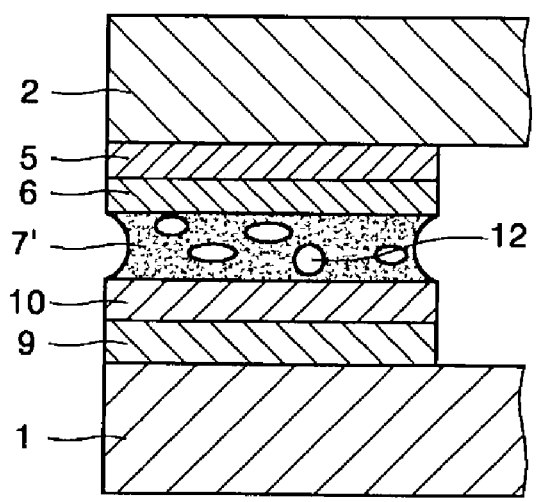

As shown in FIG. 5B, in a case where the lid 15 on which the thin layer 8' is formed is assembled in the package base 1 and is heated at a temperature over a melting point of the solder layer 7, the solder layer 7 is melted. In such a case, the thin layer 8' made up of $AuIn_2$, which is formed on the solder layer 7, is split by melted solder layer 7', and thereby grains 12' are formed. The grains 12' are absorbed into the melted solder layer 7'. In general, the melting point of $AuIn_2$ is about 540° C., and thus, $AuIn_2$, thin layer 8', does not melt at a melting temperature of a low melting point solder and is cooled in the melted solder layer 7', and the melted solder layer 7' forms a compound of each of the wetting layer 6 and the second protection layer 10, and thereby hermetic sealing is performed.

According to the present invention, the Au—In or Au—Sn-family compound is formed in the thin layer 8', thereby preventing oxidation without using an additional flux.

Figure 6:
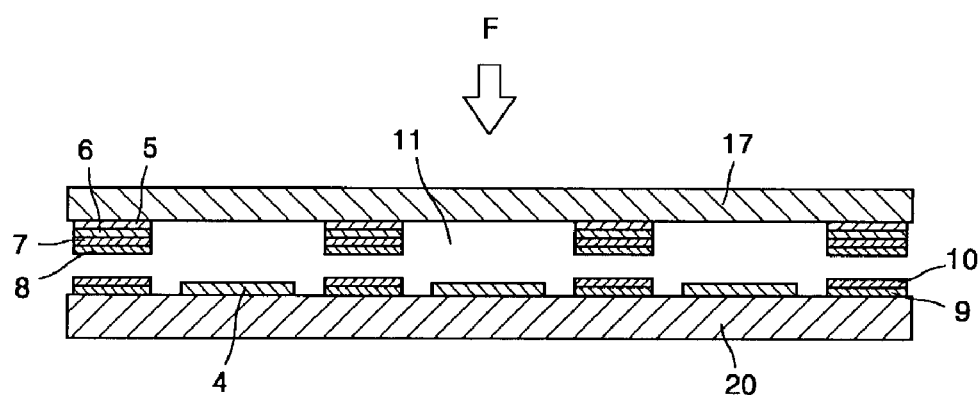
FIG. 6 illustrates an illustrative, non-limiting embodiment of the low temperature hermetic sealing method implemented with a wafer level, having a passivation layer according to the present invention.

Further, the hermetic sealing method according to the present invention may be implemented with a wafer level. Referring to FIG. 6, the junction layer 5, the wetting layer 6, the solder layer 7, and the first protection layer 8 are sequentially deposited on a lid wafer 17 and are patterned through a proper etching process or masking process. The MEMS device 4 is manufactured on a package base wafer 20, and the metal layer 9 and the second protection layer 10 are deposited on the package base wafer 20 around the MEMS device 4.

The lid wafer 17 and the package base wafer 20 are assembled so that the lid wafer 17 and the package base wafer 20 are opposite to each other, and the lid wafer 17 and the package base wafer 20 are heated and sealed. Here, the oxidation-prevention function due to the first protection layer 8 is as described above.

A deposition method that is used in the present invention includes a heat or e-beam evaporation method, a sputtering method, an electroplating method, an non-electrolysis deposition method, and a screen printing method. Among them, in the e-beam evaporation method and the sputtering method, the thickness of a layer can be comparatively facilitated, and layers that are laminated in a vacuum apparatus are combined with one another in a good state, and thereby reducing contamination.

In the low temperature hermetic sealing method having a passivation layer according to the present invention, a protection layer is laminated on a solder layer that is formed by a lid, thereby preventing oxidation without using a flux and sealing at a low temperature. The low temperature hermetic sealing method having a passivation layer is suitable for sealing a device, which is weak to heat or water and other by-product, such as a MEMS device. In addition, the combination of layers is advantageous, and contamination can be reduced, and thus, a solder junction portion having a uniform and delicate thickness of about several μms can be formed after a sealing process, the formation of an oxide layer is prevented, and a rise in a melting point can be prevented, thereby, a high quality sealing process can be performed at a predetermined temperature.

Further, in the sealing method according to the present invention, a batch process of a wafer level can be performed, and thus, it is possible for the uniform quality and mass of hermetic sealing to be cost-efficient.

The above and other features of the invention including various and novel method steps have been particularly described with reference to the accompanying drawings and pointed out in the claims. It will be understood that the particular fabrication method embodying the invention is shown by way of illustration only and not as a limitation of the invention. The principles and features of this invention may be employed in varied and numerous embodiments without departing from the scope of the invention.

What is claimed is:

1. A low temperature hermetic sealing method having a passivation layer, the method comprising:
   depositing a junction layer, a wetting layer, and a solder layer on a prepared lid frame;
   depositing a first protection layer for preventing oxidation on the solder layer and forming a lid;
   preparing a package base on which a device is disposed, and in which a metal layer and a second protection layer are formed around the device; and
   assembling, heating, and sealing the lid and the package base;
   wherein, when heating the base and the lid, the first protection layer is absorbed into the solder layer.

2. The method of claim 1, wherein the lid frame is formed of one selected from glass, quartz, Si, ceramic, and Kovar.

3. The method of claim 1, wherein the junction layer is formed of one selected from Cr, Ti, and an alloy of Cr and Ti.

4. The method of claim 1, wherein the wetting layer is formed of one selected from Ni, Cu, and an alloy of Ni and Cu.

5. The method of claim 1, wherein the solder layer is formed of at least one selected from In, Sn, Bi, Ag, and Zn.

6. The method of claim 1, wherein the first protection layer is formed of Au.

7. The method of claim 1, wherein the lid frame comprises the junction layer, the wetting layer, the solder layer, and the first protection layer on the solder layer, and wherein the lid is sealed with the base via soldering of the solder layer.

8. The method according to claim 1, wherein, after the heating, the first protection layer becomes grains in the melted solder.

9. A low temperature hermetic sealing method having a passivation layer, the method comprising:
   laminating a junction layer, a wetting layer, and a solder layer on a wafer and forming a lid wafer;
   depositing a first protection layer for preventing oxidation on the solder layer;
   manufacturing micro-electromechanical system (MEMS) devices on a package base wafer;
   depositing a metal layer and a second protection layer on the package base wafer;
   assembling the lid wafer and the package base wafer so that the lid wafer and the package base wafer are opposite to each other;
   heating the lid wafer and the package base wafer so that the first protection layer is absorbed into the solder layer;
   sealing the lid wafer and the package base wafer; and
   dicing the sealed wafer in units of the MEMS devices.

10. The method of claim 9, wherein the first protection layer is formed of Au.

* * * * *